(12) United States Patent
Jin et al.

(10) Patent No.: US 7,435,996 B2
(45) Date of Patent: Oct. 14, 2008

(54) NANOWIRE LIGHT EMITTING DEVICE AND METHOD OF FABRICATING THE SAME

(75) Inventors: Young-gu Jin, Hwaseong-si (KR); Sung-hoon Lee, Yongin-si (KR); Hyo-sug Lee, Suwon-si (KR); Byoung-lyong Choi, Seoul (KR); Jong-seob Kim, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 2 days.

(21) Appl. No.: 11/100,377

(22) Filed: Apr. 7, 2005

(65) Prior Publication Data

US 2005/0227391 A1 Oct. 13, 2005

(30) Foreign Application Priority Data

Apr. 7, 2004 (KR) .................. 10-2004-0023804

(51) Int. Cl.
*H01L 33/00* (2006.01)
*H01L 51/50* (2006.01)

(52) U.S. Cl. .................. 257/88; 257/40; 257/E51.026; 438/82; 438/99

(58) Field of Classification Search .................. 257/13, 257/28, 40, 79, 88, 94, 96–97, 103, E51.012–E51.023, 257/E51.026; 438/82, 99
See application file for complete search history.

(56) References Cited

U.S. PATENT DOCUMENTS 5,075,743 A * 12/1991 Behfar-Rad .................. 257/97

5,332,910 A * 7/1994 Haraguchi et al. ............ 257/13
7,254,151 B2 * 8/2007 Lieber et al. ............. 372/44.01

(Continued)

FOREIGN PATENT DOCUMENTS

KR 2004-418 1/2004

OTHER PUBLICATIONS

Ng, Kwok K., Complete Guide to Semiconductor Devices. New York: John Wiley & Sons. 2002. pp. 405-406.*

(Continued)

*Primary Examiner*—Douglas M. Menz
*Assistant Examiner*—Matthew W Such
(74) *Attorney, Agent, or Firm*—Sughrue Mion, PLLC

(57) ABSTRACT

A nanowire light emitting device and a method of fabricating the same are provided. The nanowire light emitting device includes a first conductive layer formed on a substrate, a plurality of nanowires vertically formed on the first conductive layer, each of the nanowires having an n-type doped portion and a p-type doped portion, a light emitting layer between the n-type doped portion and the p-type doped portion, first and second conductive organic polymers filling a space corresponding to the p-type doped portion and the n-type doped portion, respectively, and a second conductive layer formed on the nanowires. The organic polymers dope the corresponding surface of the nanowires by receiving electrons from the corresponding surface of the nanowires or by providing electrons to the surface of the nanowires.

6 Claims, 4 Drawing Sheets

U.S. PATENT DOCUMENTS

| | | | |
|---|---|---|---|
| 2002/0172820 A1* | 11/2002 | Majumdar et al. | 428/357 |
| 2002/0175408 A1* | 11/2002 | Majumdar et al. | 257/734 |
| 2003/0168964 A1* | 9/2003 | Chen | 313/495 |
| 2004/0003839 A1* | 1/2004 | Curtin | 136/250 |
| 2004/0109666 A1* | 6/2004 | Kim | 385/147 |
| 2005/0006673 A1* | 1/2005 | Samuelson et al. | 257/232 |
| 2006/0207647 A1* | 9/2006 | Tsakalakos et al. | 136/256 |

OTHER PUBLICATIONS

Guk, E.G., et al. "Dopant Impurity Diffusion from Polymer Diffusants and its Applications in Semiconductor Device Technology. A Review." Semiconductors. vol. 33, No. 3 (1999): pp. 265-275.*

* cited by examiner

NANOWIRE LIGHT EMITTING DEVICE AND METHOD OF FABRICATING THE SAME

This application claims priority from Korean Patent Application No. 2004-23804, filed on Apr. 7, 2004, in the Korean Intellectual Property Office, the disclosure of which is incorporated herein in its entirety by reference.

BACKGROUND OF THE INVENTION

1. Field of the Invention

The present invention relates to a nanowire light emitting device and a method of fabricating the same, and more particularly, to a nanowire light emitting device producible with low manufacturing cost and with a large size and a method of fabricating the nanowire light emitting device.

2. Description of the Related Art

A light emitting diode (LED) using gallium-nitride (GaN) semiconductor is under study. Although the GaN-based LED has high light emitting efficiency, it has a mismatch problem with a substrate, thus making it difficult to produce a large-sized device.

Technology in which a light emitting device uses a nanostructure such as a nanowire is being developed. Japanese Patent Laid-Open Publication No. Hei 10-326888 discloses a light emitting device comprising a nanowire composed of silicon and a method of fabricating the light emitting device. After a catalytic layer such as gold is deposited on a substrate, the silicon nanowire is grown from the catalytic layer by flowing silicon tetrachloride (SiCl4) gas into a reactor. The silicon nanowire light emitting device, although being manufactured at a low cost, has a low light emitting efficiency.

U.S. patent Publication No. 2003/0168964 discloses a nanowire light emitting device having a p-n diode structure. In this case, the lower portion of the-nanowire is an n-type nanowire and the upper portion is a p-type nanowire, and light is emitted from the junction region between the two portions. Other components are added using a vapor phase-liquid phase-solid phase (VLS) method in order to fabricate a nanowire light emitting device having the p-n junction structure.

As the nanowire having the p-n junction structure is grown on a catalytic layer, the n-type nanowire and the p-type nanowire are sequentially formed, thus making it difficult to obtain a high quality p-n junction structure.

SUMMARY OF THE INVENTION

The present invention provides a light emitting device having a nanowire structure in which p-type and n-type doped portions of a nanowire are formed by contacting an organic polymer to the surface of a grown nanowire and a method of fabricating the light emitting device.

According to an aspect of the present invention, there is provided a nanowire light emitting device comprising: a substrate; a first conductive layer formed on the substrate; a plurality of nanowires vertically formed on the first conductive layer, each of the nanowires comprising an n-type doped portion and a p-type doped portion; a light emitting layer between the n-type doped portion and the p-type doped portion; an organic polymer interposed between the p-type doped portion or the n-type doped portion of the nanowires and which dopes the corresponding surface of the nanowires by receiving electrons from the surface of the corresponding doped portion of the nanowires or by providing electrons to the surface of the nanowires; and a second conductive layer formed on the nanowires and the organic polymer.

The light emitting layer may be a boundary between the p-type doped portion and the n-type doped portion. The light emitting layer may be an undoped intrinsic layer interposed between the p-type doped portion and the n-type doped portion. The organic polymer may be composed of a polymer having a high electron affinity. The organic polymer may be a fluorine-based polymer or a sulfide-based polymer. The organic polymer may be a polystyrene sulfonate-based polymer.

The organic polymer may be composed of a polymer having a low ionization potential. The organic polymer may contain an alkali metal. The organic polymer may include at least one selected from the group consisting of NaCl10H8, Na2Ph2CO, and LiPh(CH2)6Ph. The organic polymer may be a polyphenylene vinylene (PPV) or a CN—PPP-based conductive polymer.

The nanowires may be composed of ZnO.

According to another aspect of the present invention, there is provided a nanowire light emitting device comprising: a substrate; a first conductive layer formed on the substrate; a plurality of nanowires vertically formed on the first conductive layer, each of the nanowires comprising an n-type doped portion and a p-type doped portion; and a light emitting layer between the n-type doped portion and the p-type doped portion; and a second conductive layer formed on the nanowires, wherein one of the p-type doped portion and the n-type doped portion is formed by adsorbing an organic molecule and the other doped portion is p-type or n-type doped by reaction with an organic polymer surrounding the other doped portion.

According to another aspect of the present invention, there is provided a nanowire light emitting device comprising: a substrate; a first conductive layer formed on the substrate; a plurality of nanowires vertically formed on the first conductive layer; a second conductive layer formed on the nanowires; a wall frame that is interposed between the first conductive layer and the second conductive layer and forms a sealing space; and an electrolyte filling the sealing space.

According to another aspect of the present invention, there is provided a method of fabricating a nanowire light emitting device, the method comprising: forming a first electrode layer on a substrate; forming a plurality of nanowires vertically on the first electrode layer; p-doping or n-doping lower portions of the nanowires by filling a first organic polymer between the lower portions of the nanowires; n-doping or p-doping upper portions of the nanowires with a different polarity from a polarity of the lower portion of the nanowires by filling a second organic polymer between the upper portions of the nanowires; and forming a second electrode layer on the nanowires.

The p-doping or n-doping of the lower portion of the nanowires may comprise: filling a space between the nanowires with the first organic polymer, which contains molecules having a high electric affinity or a low ionization potential; and etching the first organic polymer in the upper portions of the nanowires.

The n-doping or p-doping of the upper portions of the nanowires may comprise filling the upper portions of the nanowires with the second organic polymer containing molecules having a low ionization potential or a high electric affinity such that the upper portions of the nanowires have the opposite polarity to the polarity of the lower portions of the nanowires.

Alternatively, the n-doping or p-doping of the upper portions of the nanowires may comprise: forming a undoped intrinsic portion in the nanowires by filling an insulating polymer between the nanowires on the first organic polymer to a predetermined height; and filling a second organic polymer containing molecules having a low ionization potential or a high electric affinity on the intrinsic portion such that the upper portions of the nanowires have the opposite polarity to the polarity of the lower portions of the nanowires.

DETAILED DESCRIPTION OF THE INVENTION

Figure 1:
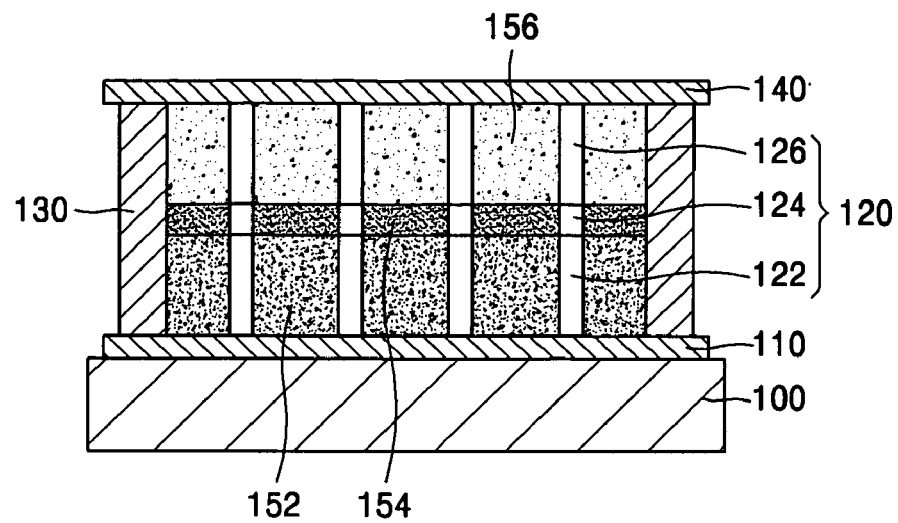
FIG. 1 is a cross-sectional view of a nanowire light emitting device according to a first exemplary embodiment of the present invention.

A nanowire light emitting device and a method of fabricating the same according to the present invention will become more apparent by describing in detail exemplary embodiments thereof with reference to the attached drawings. Throughout the drawings, like reference numerals refer to like elements, and their descriptions will not be repeated.

FIG. 1 is a cross-sectional view of a nanowire light emitting device according to a first exemplary embodiment of the present invention.

Referring to FIG. 1, a conductive layer (a first electrode layer) 110 is formed on a substrate 100 and a plurality of nanowires 120 are vertically formed on the conductive layer 110. A second electrode layer 140 is formed on the nanowires 120. A wall frame 130 is interposed between the first conductive layer 110 and the second conductive layer 140 and seals the space where the nanowires 120 are formed.

The nanowires 120 each have a p-type doped portion 122, an n-type doped portion 126 and an intrinsic portion 124, which is a light emitting layer between the p-type doped portion 122 and the n-type doped portion 126. The intrinsic portion 124 is not doped.

A first organic polymer 152, an insulating polymer 154, and a second organic polymer 156 respectively fill the spaces between the p-type doped portion 122, the intrinsic portion 124, and the n-type doped portions 126 of the nanowires 120.

The substrate 100 may be a silicon wafer, sapphire wafer, or flat metal film.

The first electrode layer 110 may be deposited of aluminum, gold, or magnesium. The second electrode layer 140 may be formed of a transparent electrode, for example, an ITO.

The wall frame 130 is composed of an insulating material, for example, glass.

The nanowires 120 may be composed of ZnO, GaN, GaAs, InGaN, CdS, or Si. The light emitted from the light emitting device varies according to the material that the nanowires 120 are composed of. When the nanowires are composed of ZnO, ultraviolet rays are emitted. When the nanowires are composed of Si, infrared rays are emitted. When the nanowires are composed of GaN, ultraviolet rays or blue light are emitted. When the nanowires are composed of InGaN, blue light is emitted. When the nanowires are composed of CdS, green light is emitted. When the nanowires are composed of GaAs, red light is emitted. The nanowires may each have a diameter of 20-100 nm and a length of 1 μm.

The nanowires have a p-i-n junction structure composed of the p-type doped portion 122, an n-type doped portion 126, and the intrinsic portion 124.

The first polymer 152 may be a polymer having a high electron affinity such as an organic electron acceptor polymer, which is a polymer containing fluorine or sulfur. The first polymer 152 may be a fluorsulfate, a fluoracetate, or a sulfonate based polymer. For example, polystyrene sulfonate (PSS) may be used as the first polymer 152. Because the first polymer 152 removes electrons from the surfaces of the nanowires 120 corresponding to the p-type doped portion 122, holes are formed on the surface of the p-type doped portion 122. In this way, the first polymer 152 forms the p-type doped portion 122 in the nanowires 120 because electrons in the nanowires 120 move to the polymer 152 when the energy potential of the lowest unoccupied molecular orbital (LUMO) of the first polymer 152 is similar to or lower than that of the valence band of the nanowires 120.

The second polymer 156 may be an organic electron donor polymer composed of low ionization potential molecules, for example, an organic electron donor polymer such as NaC110H8, Na2Ph2CO, or LiPh(CH2)6Ph, which contain an alkali metal, a poly p-phenylene vinylene (PPV) based conductive polymer, or a poly[2-(6-cyano-6'-methylheptyloxy)-1,4-phenylene] (CN—PPP) based conductive polymer. The highest occupied molecular orbital (HOMO) of these polymers have high energy potentials. Because the second polymer 156 provides electrons to the surface of the nanowires 120 corresponding to the n-type doped portion 126, free electrons are generated on the surface of the n-type doped portion 126. In this way, the second polymer 156 forms the n-type doped portion 126 of the nanowires 120 because electrons in the polymer 156 move to the nanowires 120 when the energy potential of the HOMO of the second polymer 156 is similar to or higher than that of the conduction band of the nanowires 120.

The insulating polymer 154 prevents electronic contact between the nanowires 120. A photoresist may be used as the insulating polymer 154.

The operation of a light emitting device having the above structure is described with reference to the attached drawings.

First, holes from the p-type doped portion 122 and the electrons from the n-type doped portion 126 combine in the intrinsic portion 124 when a positive voltage is applied to the first electrode layer 110 connected to the p-type doped portion 122 of the nanowires 120 and a negative voltage is applied to the second electrode layer 140 connected to the n-type doped portion 126 of the nanowires 120, thus emitting light. The light emitted from the intrinsic portion 124 passes through a transparent electrode layer such as the second electrode layer 140 and is emitted to the outside.

Figure 2:
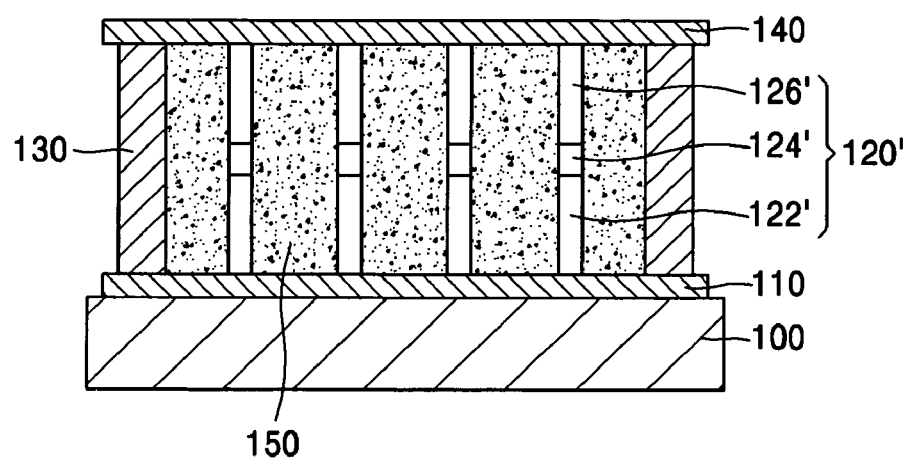
FIG. 2 is a cross-sectional view of a nanowire light emitting device according to a second exemplary embodiment of the present invention.

FIG. 2 is a cross-sectional view of a nanowire light emitting device according to a second exemplary embodiment of the present invention.

Referring to FIG. 2, a nanowire 120' has a p-i-n junction structure comprising a p-type doped portion 122', an n-type doped portion 126', and an intrinsic portion 124'.

The p-type doped portion 122' is a portion where a p-type dopant is adsorbed onto the circumference of the nanowires 120'. The p-type dopant may be a molecule having a high electron affinity, for example, an electron acceptor molecule such as tetrafluoro-tetracyano-quinodimethane (F4-TCNQ). Because the p-type dopant removes electrons from the surface of the nanowires 120', holes are formed on the portions of the nanowires 120' where the p-type dopant is adsorbed, thus forming the p-type doped portion 122'.

The n-type doped portion 126' is a portion where an n-type dopant is adsorbed onto the circumference of the nanowires 120'. The n-type dopant may be a molecule having a low ionization potential, for example an organic electron donor molecule such as bis(ethylenddithio)tetrathiafulvalene (BEDT-TTF). Because the n-type dopant provides electrons to the surface of the nanowires 120', free electrons attach to the surface of the portion of the nanowires 120' where the n-type dopant is adsorbed, thus forming the n-type doped portion 126'.

An insulating polymer 150 is interposed between the nanowires 120', thus preventing electronic contact between the nanowires 120'. A photoresist may be used as the insulating polymer 150.

The operation of a light emitting device having the structure shown in FIG. 2 is similar to that of the light emitting device shown in FIG. 1, and thus its description will be omitted.

As illustrated in the second exemplary embodiment, similar to the first exemplary embodiment, the p or n doped portion may be doped by adsorption and the surroundings of the nanowires may be filled with an insulating polymer.

Figure 3:
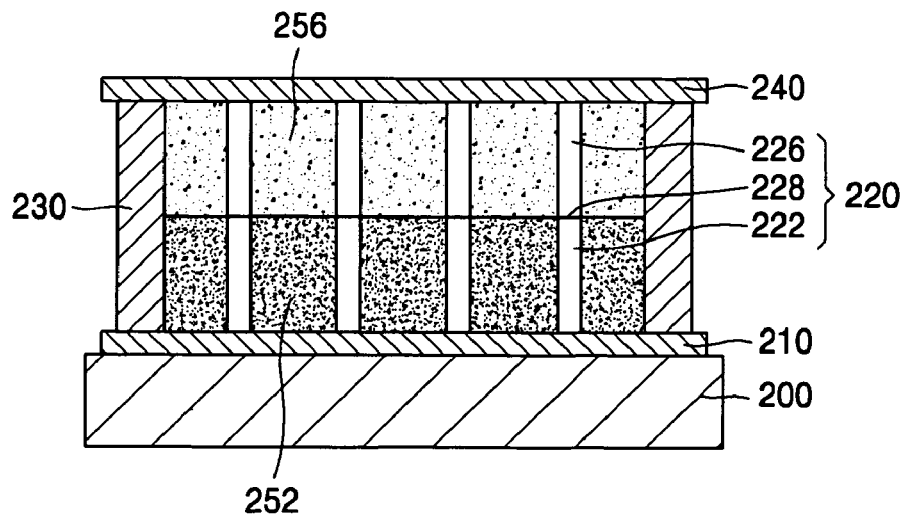
FIG. 3 is a cross-sectional view of a nanowire light emitting device according to a third exemplary embodiment of the present invention.

FIG. 3 is a cross-sectional view of a nanowire light emitting device according to a third exemplary embodiment of the present invention.

Referring to FIG. 3, a conductive layer (a first electrode layer) 210 is formed on a substrate 200 and a plurality of nanowires 220 are formed roughly at right angles to the conductive layer 110. A conductive layer (a second electrode layer) 240 is formed on the nanowires 220. A wall frame 230 sealing the space where the nanowires 220 are formed is interposed between the first electrode layer 210 and the second electrode layer 240.

The nanowires 220 each include a p-type doped portion 222 and an n-type doped portion 226 contacting each other. The contact region of the two doped portions forms a light emitting interface 228. Such a light emitting structure has a p-n junction structure as opposed to the p-i-n junction structure of the first exemplary embodiment.

A first organic polymer 252 and a second organic polymer 256 respectively fill the spaces between the p-type doped portions 222 and the spaces between the n-type doped portion 226.

In a light emitting device having such a structure, light is emitted from the light emitting interface 228 when direct current is addressed to both ends of the nanowires 220.

In the second embodiment shown in FIG. 2, the surface of nanowires may be adsorbed by a predetermined dopant and a space between the nanowires may be filled with an insulating polymer.

Figure 4:
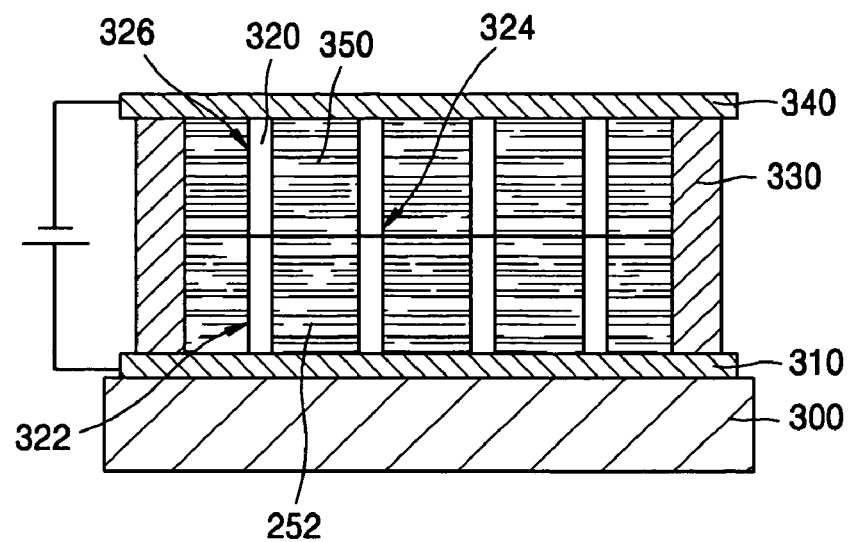
FIG. 4 is a cross-sectional view of a nanowire light emitting device according to a fourth exemplary embodiment of the present invention.

FIG. 4 is a cross-sectional diagram of a nanowire light emitting device according to a fourth exemplary embodiment of the present invention.

Referring to FIG. 4, a conductive layer (a first electrode layer) 310 is formed on a substrate 300 and a plurality of nanowires 320 are formed roughly at right angles to the conductive layer 310. A conductive layer (a second electrode layer) 340 is formed on the nanowires 320. A wall frame 330 sealing the space where the nanowires 320 are formed is interposed between the first electrode layer 310 and the second electrode layer 340. An electrolyte 350 is filled in the sealing space formed by the first and second electrode layers 310 and 340 and the wall frame 330.

In the light emitting device having such a structure, when a direct current is supplied to both ends of the nanowires 320, ions in the electrolyte 350 are divided and move to upper and lower portions of the electrolyte 350. That is, negative ions gather around a portion of the nanowires 320 near the first electrode layer 310, where a positive voltage is applied, and remove electrons from the corresponding surface of the nanowires 320, thus forming a p-type doped portion 322 while positive ions gather around a portion of the nanowires 320 near the second electrode layer 340, wherein a negative voltage is applied, and provide electrons to the corresponding surface of the nanowires 320, thus forming an n-type doped portion 326. Therefore, a boundary 324 is formed between the p-type doped portion 322 and the n-type doped portion 326. At the boundary 324, holes from the p-type doped portion 322 of the nanowires 320 and electrons from the n-type doped portion 326 combine and emit light.

FIG. 5 through FIG. 10 are cross-sectional views illustrating a method of fabricating a nanowire light emitting device according to a fifth exemplary embodiment of the present invention.

Figure 5:
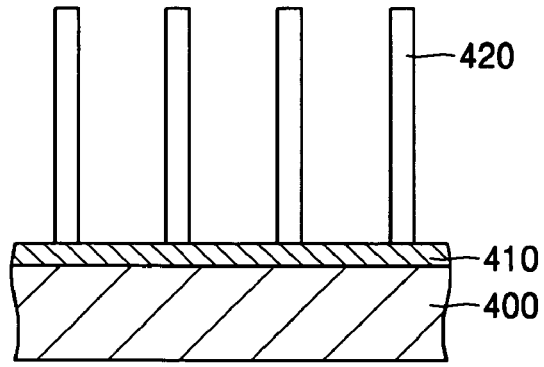
FIGS. 5 through 10 are cross-sectional views illustrating a method of fabricating a nanowire light emitting device according to an exemplary embodiment of the present invention.

Referring to FIG. 5, a first conductive layer 410 such as an aluminum layer is deposited on a substrate 400. A plurality of nanowires 420 are formed to a length of 1 μm on the aluminum layer 410 using a metal-organic-vapor phase epitaxy (MOVPE) method. The nanowires 420 may be formed of ZnO using diethyl-zinc (DEZn) and oxygen as a reacting source. However, the method of fabricating the nanowires 220 is not limited to the current exemplary embodiment.

The nanowires 420 may be formed using a conventional vapor phase-liquid phase-solid phase (VLS) method, a self-assembly method, or a method using a metal catalytic layer.

Figure 6:
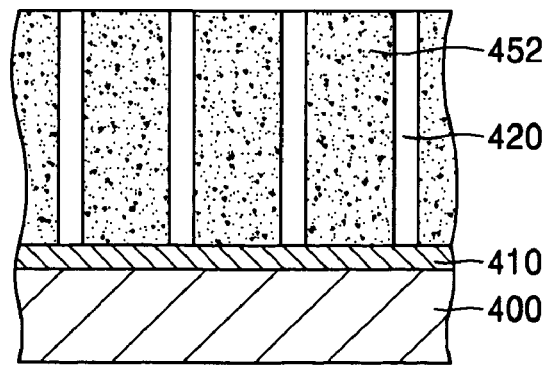

Referring to FIG. 6, a space between the nanowires 420 is filled with a first polymer 452 having a high electron affinity such as a poly styrene sulfonate (PSS). The first polymer 452 removes electrons from the surfaces of the nanowires 420 and p-dopes the surfaces of the nanowires 420.

Figure 7:
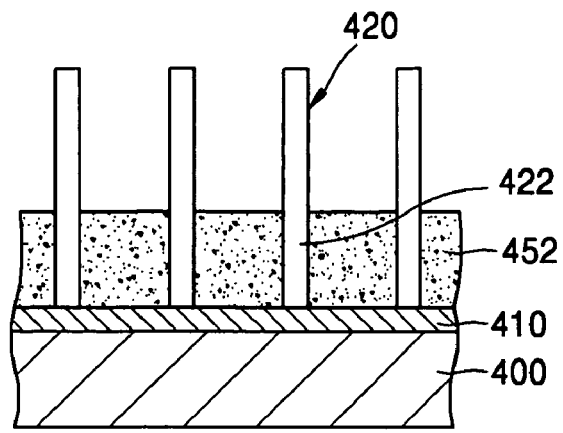

Referring to FIG. 7, an upper portion of the first polymer 452 is removed by oxygen plasma or wet etching. A p-type doped portion 422 is only formed on a portion of the surface of the nanowires 420 that is in contact with the remaining first polymer 452.

Figure 8:
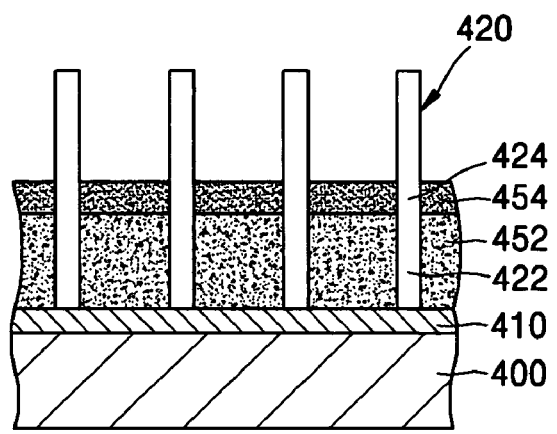

Referring to FIG. 8, a thin photoresist 454 is spin-coated on the first polymer 452, filling the space between the nanowires 420. The photoresist 454 is then selectively removed by wet etching or oxygen plasma. Thus the photoresist 454 having a predetermined height is formed on the p-type doped portion 422. The portion of the nanowires surrounded by the photoresist 422 is not a doped portion and forms an intrinsic portion 424.

Figure 9:
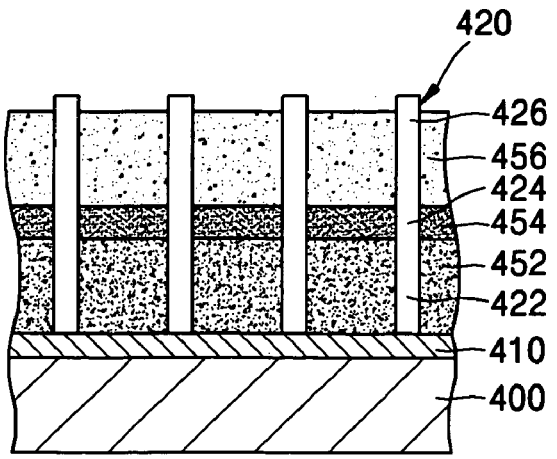

Referring to FIG. 9, a second polymer 456 such as a PPV or CN—PPP based polymer, which contains a molecule having a low ionization potential, is formed on the photoresist 454, filling a space between the nanowires 420. The second polymer 456 provides electrons to a portion of the surface of the nanowires 420, thereby forming an n-type doped portion 426. Then, the second polymer 456 between the nanowires 420 is selectively removed by wet etching or oxygen plasma such that the upper portion of the n-type doped portion 426 is exposed.

Figure 10:
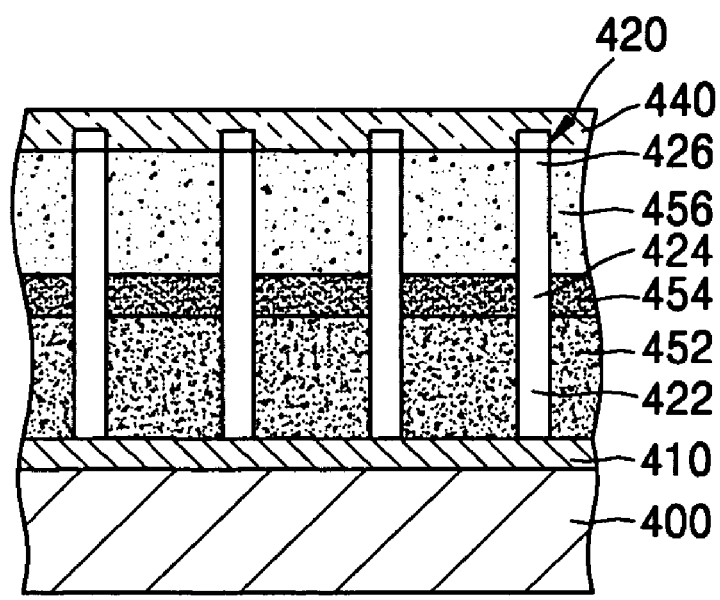

Referring to FIG. 10, a second conductive layer 440 covering the nanowires 420 is formed on the photoresist 432.

The light emitting device fabricated by the above method has the p-i-n junction structure of FIG. 1.

A method of fabricating a light emitting device having the p-n junction structure of FIG. 3 is similar to the above method except that the process of forming an intrinsic portion shown in FIG. 8 is not included, and thus its description will be omitted.

A method of fabricating a light emitting device having the structure shown in FIG. 2 is similar to the above method except that the process of filling the space between the nanowires with an insulating polymer after respectively adsorbing molecules having a high electron affinity or a low ionization potential on a p-type doped portion or an n-type doped portion, respectively, is not included, and thus a description thereof will be omitted.

A nanowire light emitting device according to exemplary embodiments of the present invention comprises a homogenous junction, thus has a high light emitting efficiency. The device can be mass-produced because the matching with a substrate is excellent. Also, the device can be directly applied to a flat display because it can be produced with a large size.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nanowire light emitting device comprising:
   a substrate;
   a first conductive layer formed on the substrate;
   a plurality of nanowires vertically formed on the first conductive layer, each of the nanowires comprising an n-type doped portion and a p-type doped portion;
   a light emitting layer between the n-type doped portion and the p-type doped portion;
   an organic polymer interposed between the p-type doped portion or the n-type doped portion of adjacent nanowires and doping the corresponding surface of the nanowires by receiving electrons from the surface of the corresponding doped portion of the nanowires or by providing electrons to the surface of the nanowires;
   an insulating non-doping polymer interposed between undoped intrinsic portions of the adjacent nanowires; and
   a second conductive layer formed on the nanowires and the organic polymer,
   wherein the light emitting layer comprises an undoped intrinsic portion interposed between the p-type doped portion and the n-type doped portion.

2. The device of claim 1, wherein the nanowires are composed of ZnO.

3. A nanowire light emitting device, comprising:
   a substrate;
   a first conductive layer formed on the substrate;
   a plurality of nanowires vertically formed on the first conductive layer, each of the nanowires comprising an n-type doped portion and a p-type doped portion;
   a light emitting layer between the n-type doped portion and the p-type doped portion;
   an organic polymer interposed between the p-type doped portion or the n-type doped portion of the nanowires and doping the corresponding surface of the nanowires by receiving electrons from the surface of the corresponding doped portion of the nanowires or by providing electrons to the surface of the nanowires; and
   a second conductive layer formed on the nanowires and the organic polymer,
   wherein the organic polymer is composed of a polymer having a high electron affinity,
   wherein the organic polymer comprises a fluorine-based polymer or a polystyrene sulfonate-based polymer.

4. A nanowire light emitting device, comprising:
   a substrate;
   a first conductive layer formed on the substrate;
   a plurality of nanowires vertically formed on the first conductive layer, each of the nanowires comprising an n-type doped portion and a p-type doped portion;
   a light emitting layer between the n-type doped portion and the p-type doped portion;
   an organic polymer interposed between the p-type doped portion or the n-type doped portion of the nanowires and doping the corresponding surface of the nanowires by receiving electrons from the surface of the corresponding doped portion of the nanowires or by providing electrons to the surface of the nanowires; and
   a second conductive layer formed on the nanowires and the organic polymer,
   wherein the organic polymer is composed of a polymer having a low ionization potential,
   wherein the organic polymer includes an alkali metal.

5. The device of claim 4, wherein the organic polymer includes at least one selected from the group consisting of $NaC_{11}H_8$, $Na_2Ph_2CO$, and $LiPh(CH_2)_6Ph$.

6. A nanowire light emitting device, comprising:
   a substrate;
   a first conductive layer formed on the substrate;
   a plurality of nanowires vertically formed on the first conductive layer, each of the nanowires comprising an n-type doped portion and a p-type doped portion;
   a light emitting layer between the n-type doped portion and the p-type doped portion;
   an organic polymer interposed between the p-type doped portion or the n-type doped portion of the nanowires and doping the corresponding surface of the nanowires by receiving electrons from the surface of the corresponding doped portion of the nanowires or by providing electrons to the surface of the nanowires; and
   a second conductive layer formed on the nanowires and the organic polymer,
   wherein the organic polymer is composed of a polymer having a low ionization potential,
   wherein the organic polymer comprises a polyphenylene vinylene (PPV) or a CN—PPP-based conductive polymer.

* * * * *